United States Patent [19]

Rajaram et al.

[11] Patent Number: 4,984,209
[45] Date of Patent: Jan. 8, 1991

[54] BURST REFRESH OF DYNAMIC RANDOM ACCESS MEMORY FOR PERSONAL COMPUTERS

[75] Inventors: Babu Rajaram, St. Joseph; Mark J. Foster, Stevensville, both of Mich.

[73] Assignee: Zenith Data Systems Corporation, Mt. Prospect, Ill.

[21] Appl. No.: 114,770

[22] Filed: Oct. 30, 1987

[51] Int. Cl.$^5$ .............................................. G11C 7/00
[52] U.S. Cl. .................................................... 365/222
[58] Field of Search ......................................... 365/222

[56] References Cited

U.S. PATENT DOCUMENTS

| | | | |
|---|---|---|---|
| 3,737,879 | 6/1973 | Greene et al. | 365/222 |
| 4,084,154 | 4/1978 | Panigrahi | 365/222 |
| 4,639,858 | 1/1987 | Murray, Jr. | 365/222 |
| 4,691,303 | 9/1987 | Churchward et al. | 365/222 |
| 4,802,118 | 1/1989 | Honda et al. | 365/222 |

*Primary Examiner*—James W. Moffitt
*Attorney, Agent, or Firm*—Neuman, Williams, Anderson and Olson

[57] ABSTRACT

An improved method for refreshing dynamic random access memory devices is disclosed. Normal refresh clocking signals are monitored and a count accumulated up to a selected value. Refresh operations are then initiated less frequently and only when the selected count has been accumulated. Once control of the bus to the memory has been achieved, a burst of refresh operations are performed prior to release of the bus. Improved efficiency and operating speed may be achieved by minimizing wasted time associated with acquisition and control of the bus. A preferred embodiment illustrates savings associated with a burst of four refresh operations each time the bus to the memory device is acquired for refreshing. Page addressing techniques are enhanced by forcing a change of state of the row address strobe line bus frequently than typical refresh operations.

12 Claims, 5 Drawing Sheets

BURST REFRESH OF DYNAMIC RANDOM ACCESS MEMORY FOR PERSONAL COMPUTERS

BACKGROUND OF THE INVENTION

The present invention generally relates to the computer art. More particularly, the present invention relates to maintaining the integrity of information stored in a memory in a computer. Specifically, the present invention provides an improved technique for maintaining or refreshing information stored in a dynamic random access memory which enhances system performance.

As is well known, data or information stored in a dynamic random access memory (DRAM) must be refreshed or updated periodically to preserve the integrity of the information. The time period between refreshing operations varies from manufacturer to manufacturer and with the size of the memory chip. A typical refresh specification for a 256K DRAM may be 4 mSec., while a 1M DRAM may have a specification of 8 mSec or more. Accordingly, each row of DRAM must be addressed and refreshed once every specified period., e.g. 4 mSec., or the integrity of the data stored in the DRAM cannot be assured.

The typical home computer or personal computer system accomplishes DRAM refresh by addressing an individual row of the DRAM, e.g. by driving the row address strobe (RAS) line for the DRAM active, once every approximately 15 $\mu$Sec. This corresponds to the refresh clock rate. Alternately, reading a row in the DRAM will accomplish the refreshing of the data stored in the row.

Although this typical method of refreshing has proven successful in most operations, it suffers from significant drawbacks in some applications. One area of insufficiency lies in the non-active computer time associated with the individual refreshing operations. Each time a refresh operation is to be done, the system must wait for completion of ongoing operations and obtain control of the appropriate address bus and control lines. Depending upon the system status at the time of a refresh request signal, the total period for completing a refresh operation of a single row may be significantly longer than the minimum time necessary—although the time elapsed for each actual refresh operation will remain about the same. As refresh operations are crucial to integrity, they typically enjoy the highest bus access priority in the computer system. The likelihood of extending the refresh time beyond the minimum necessary, thus, decreases system performance. Also, the overall system speed can become limited by the constant need to tie up the bus for a refresh operation every 15 $\mu$Sec., with the attendant bus acquisition and transfer delays. Further, repeatedly driving the RAS line inactive every 15 $\mu$Sec at the completion of a refresh cycle increases the risk of a "page miss" in addressing, which requires the introduction of wait states and in turn slows the overall system speed.

Accordingly, a principal object of the present invention is to provide an improved technique for maintaining integrity of data in a DRAM which generally overcomes the deficiencies of the prior art.

A more detailed object of the present invention lies in providing a method for DRAM refresh which increases the overall system operating speed.

Another object lies in providing a method of DRAM refresh having improved efficiency.

Yet another object may be found in providing a method for refresh of DRAM which also facilitates information addressing functions, including page addressing operations while maintaining compliance with typical DRAM specifications.

In further object of the present invention may be found in providing a method for DRAM refresh that optimizes bus time utilization in a personal computer system.

BRIEF DESCRIPTION OF THE DRAWINGS

The appended claims set forth the features of the present invention with particularity. The invention, together with its objects and advantages, may be best understood from the following detailed description taken in conjunction with the accompanying drawings of which:

DETAILED DESCRIPTION OF THE INVENTION

The present invention accomplishes the above and other objects through a burst refresh method. The system of the present invention initiates refresh operations in response to normally clocked refresh request signals. However, each refresh request signal does not cause the refresh operation to begin. The system monitors the refresh request signals. A count may be accumulated. Once a selected count has been reached, or after a selected number of refresh request signals, the system initiates refresh operations. The system then, in a burst, sequentially refreshes a number of rows in the DRAM corresponding to the number of refresh request signals received since the preceding refresh operation. The preferred embodiment initiates a refresh operation in response to every fourth clocked refresh request signal and then sequentially refreshes, in a burst, four rows in a DRAM while maintaining control of the address bus.

Figure 1:
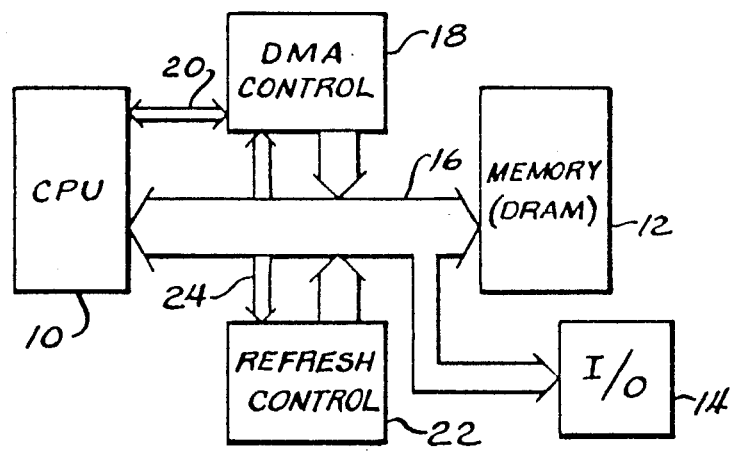
FIG. 1 is a general block diagram illustrating a personal computer system according to the present invention.

Referring now to the drawings, FIG. 1 illustrates a general block diagram of a personal computer system according to a preferred embodiment of the present invention. A CPU 10 communicates with a memory (DRAM) 12 and an input/output device 14 via a bus 16. A DMA controller 18 communicates with the CPU 10 via a control bus 20 to control the bus 16 for accomplishing DMA functions. A refresh controller 22 communicates with the DMA controller 18 via a separate control line 24 to provide refresh addresses and signals to the bus 16 for refreshing the DRAM 12. The operation of each of these devices in the preferred embodiment of the present invention may be more fully understood in conjunction with the following description of the system timing diagrams, logic operation and state machine representations for the refresh controller.

Figure 2A:
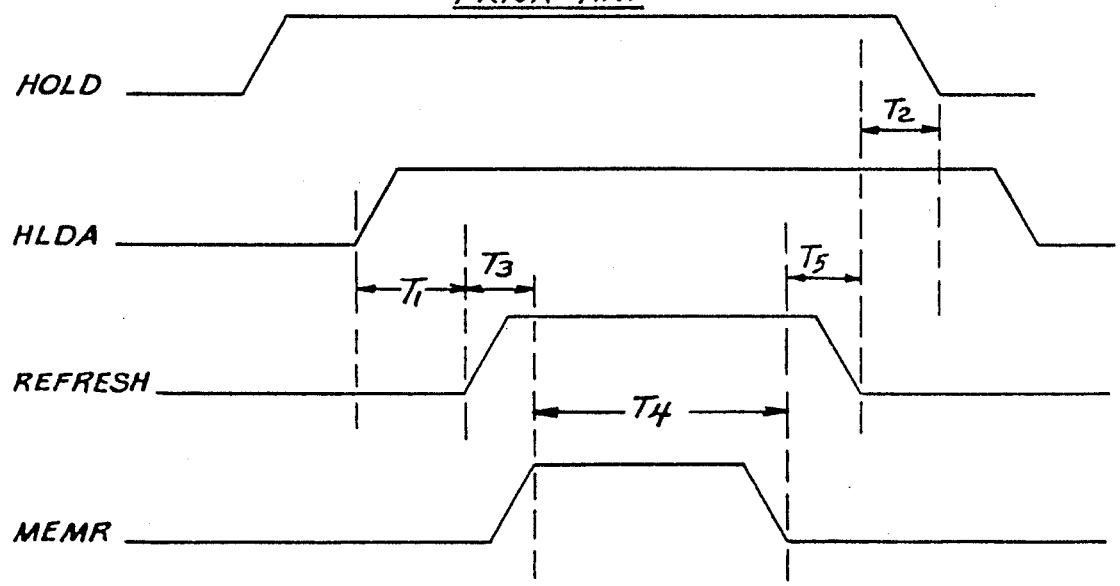
FIG. 2A is a simplified timing diagram illustrating selected signal waveforms associated with refresh operations in a non-burst or traditional mode.
Figure 2:
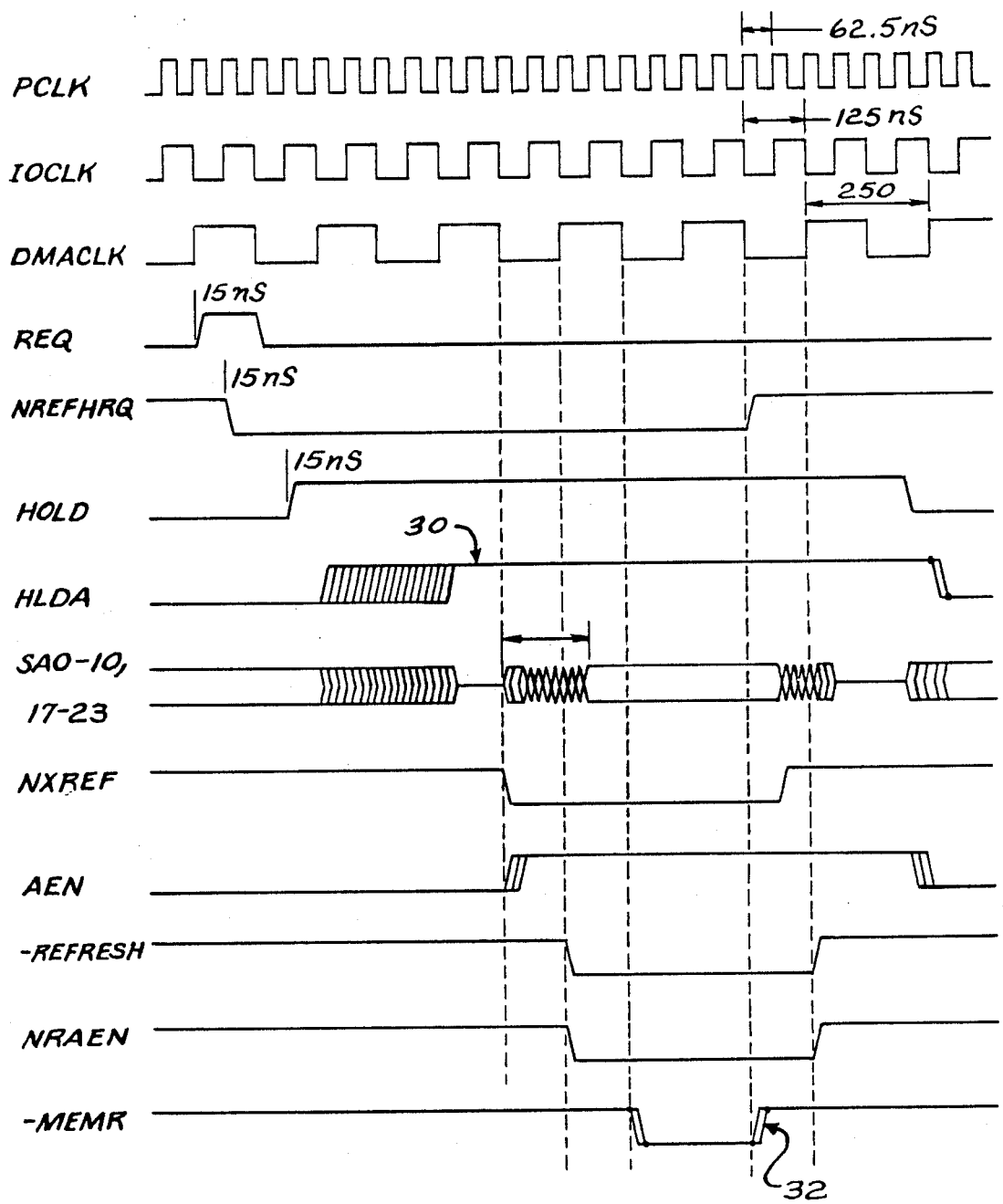
FIG. 2 is a timing diagram illustrating a prior art method of DRAM refresh.

Referring now to FIG. 2, a series of system timing waveforms illustrates a prior art DRAM refresh technique. The top waveform (PCLK) in FIG. 2 represents a processor clock signal, which in the preferred embodiment ocillates at a 16 MHz rate, providing a period of 62.5 nSec. The PCLK signal clocks the DMA controller 18, as well as providing clock signals for the functions associated with the CPU operation. The next waveform (IOCLK) in FIG. 2 represents the input/output clock signal which is a divided-down signal from the processor clock signal (PCLK). This signal is used to synchronize the refresh control operations with the correct edge of the DMA clock signal. The IOCLK signal also provides a clock to the refresh controller 22 from the DMA controller 18. The third waveform represents the DMA clock signal which again is a divided down signal from the processor clock signal (PCLK). The DMA controller 18 also communicates the DMA clock signal, DMACLK, to the refresh controller 22 to synchronize the DMA controller 18 with the refresh controller 22. This prevents timing conflicts between the DMA and refresh circuits.

The next waveform (REQ) shown in FIG. 2 represents a clocked refresh request signal indicative that a periodic refresh of a row of the DRAM should be initiated. In the system represented by the timing diagram of FIG. 2, a pulse in the REQ waveform occurs approximately once every 15 μSec. This signal causes the refresh controller 22 to communicate a refresh hold request signal to the DMA controller 18. The refresh hold request signal as communicated to the DMA controllers is shown as the next waveform (NREFHRQ) in FIG. 2. In response to the refresh hold request signal, NREFHRQ, from the refresh controller 22, the DMA controller 18 generates a hold signal, shown as the next waveform (HOLD) in FIG. 2, which it communicates to the CPU 10 seeking control of the bus 16 for refresh operations. The next waveform (HLDA) shown in FIG. 2 represents a hold acknowledge signal received by the DMA controller 18 from the CPU 10. As shown by the dashed lines at the rising edge of the pulse 30, the occurrence of this signal will be some time after the hold signal, although the exact time may not be accurately determined in advance. Accordingly, some delay must be anticipated before the CPU acknowledges that the DMA controller may allow the refresh controller 22 to acquire the bus 16.

The next waveform (SA0–10,17–23) shown on FIG. 2 represents the signals on address lines 0–10 and 17–23, which represent an eleven bit address and a seven bit page. As shown figuratively in the drawing of FIG. 2, the signals on these particular address lines will correspond to the address of the DRAM row being refreshed during the refresh operation as the refresh controller 22 gains control of the bus 16 to the memory 12.

The next waveform (NXREF) illustrated in FIG. 2 represents the signal from the DMA controller 18 acknowledging the refresh hold request (NREFHRQ) and corresponds to the next signal, AEN, which enables a DMA or refresh operation. The AEN signal is active during DMA and refresh operations. It degates the CPU and other circuit elements from the bus 16.

The next waveform (-REFRESH) illustrated in FIG. 2 represents the actual refresh signal put out on the bus 16 by the refresh controller 22 to the DRAM 12. This signal enables all banks of RAM simultaneously while disabling the CAS (Column Address Strobe) lines for all DRAM. In this fashion, the DRAM does a RAS-only refresh cycle. The next waveform (NRAEN) illustrated in FIG. 2 represents the refresh address enable signal which is generated by the refresh controller 22 to the address buffer. This signal becomes the refresh signal (-REFRESH) on the bus 16. Once a refresh signal has been sent, a memory read signal (-MEMR), the last waveform illustrated in FIG. 2, and generated from the refresh controller 22, indicates that the address on the bus 16 is valid and causes the RAS signal to go active latching that address to refresh the appropriate row in the DRAM.

Once the memory read signal (-MEMR) has terminated (shown by the rising edge of a negative pulse 32), the refresh signal (-REFRESH) subsequently terminates. The AEN signal also terminates as does the hold on the bus 16 and control is returned to the CPU 10. FIG. 2 illustrates that the refresh signal (-REFRESH) exists for only a portion of the time in which the refresh operation occupies the bus 16. In the illustrated embodiment of FIG. 2, the refresh signal endures for approximately 500 nSec. In contrast, the hold acknowledge signal, HLDA, may be active for as little as 875 nSec or as long as 1125 nSec maximum. Thus, although the refresh operation may be relatively fast, the actual refresh of the DRAM may require less than half of the time that the system bus 16 is tied up for the refresh operation.

Figure 3:
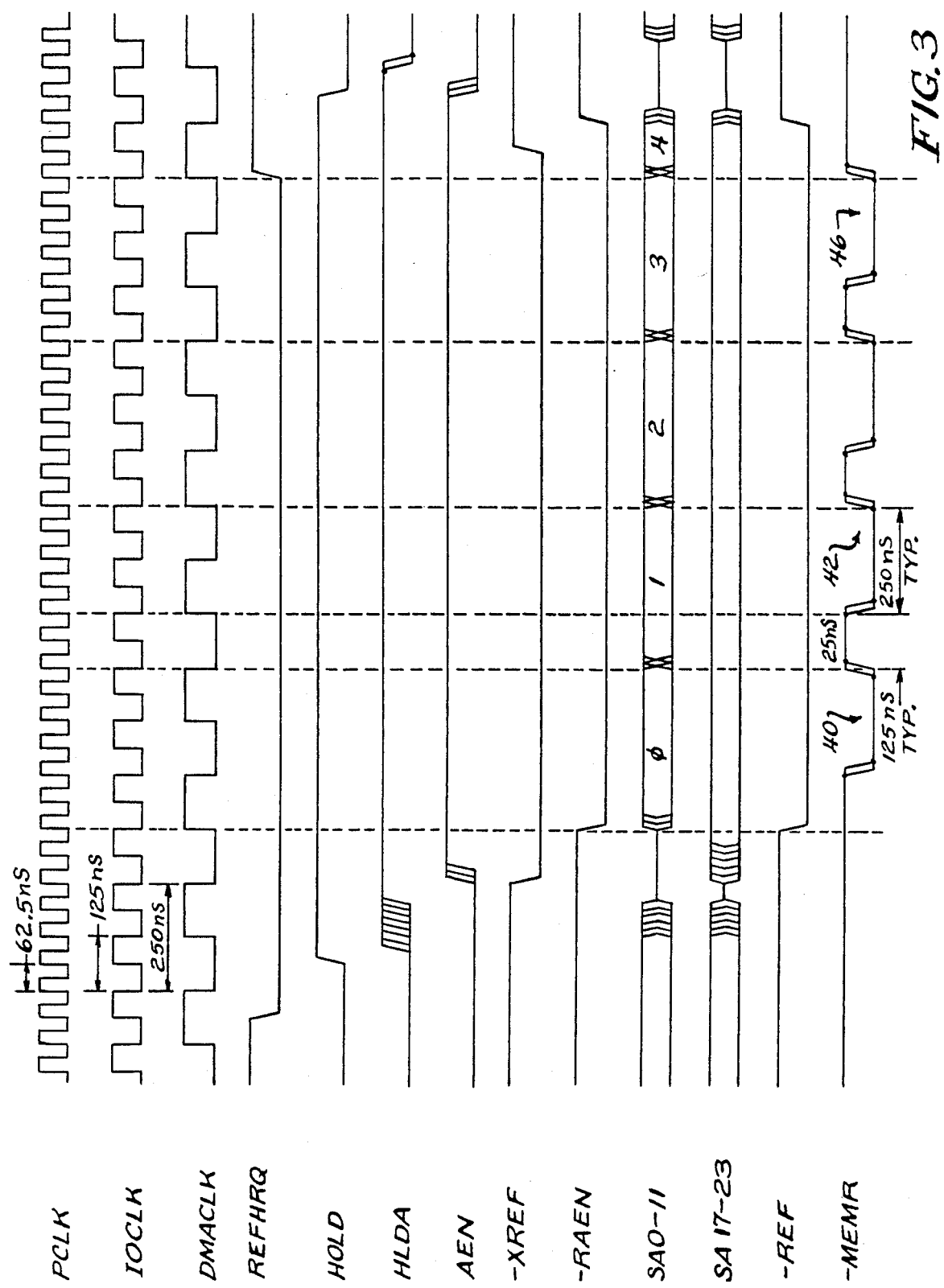
FIG. 3 is a timing diagram illustrating a preferred embodiment of DRAM refresh according to the burst method of the present invention.

Referring now to FIG. 3, the top three waveforms illustrated therein represent the processor clock (PCLK), input/output clock (IOCLK) and DMA clock (DMCLK) signals as discussed in conjunction with FIG. 2. The next waveform in FIG. 3 represents the refresh hold request signal (-REFHRQ) generated by the refresh controller 22 and communicated to the DMA controller 18 to initiate a refresh operation. As explained in conjunction with FIG. 2, the next two waveforms, HOLD and HLDA, represent the signals processed by the DMA controller 18 and communicated with the CPU 10 to acquire control of the address bus 16 for the refresh operation. Likewise, the next two waveforms, AEN and -XREF, correspond to the signals explained in conjunction with FIG. 2, which enable the refresh operation and indicate to the refresh controller that actual refresh can begin. The next waveform (-RAEN) correspondingly represents the refresh address enable signal as explained in conjunction with FIG. 2.

The next waveform (SA0–11) illustrated in FIG. 3 represents the row address signals, and the next waveform (SA17–23) represents the page address bits. As in FIG. 2, the next waveform (REF) represents the actual refresh signal put out on the bus 16 to the DRAM 12. The following and last waveform (-MEMR) of FIG. 3 represents the memory read signal supplied to the DRAM 12 in the refresh operation at the appropriate address given by the row address from the signal SA-0–11.

In contrast to the system represented by the timing diagram of FIG. 2, the system represented by the timing diagram of FIG. 3 processes the refreshing of the DRAM on a more efficient basis. In the preferred embodiment illustrated by FIG. 3, four rows are sequentially refreshed in a burst each time a refresh enable signal is generated. As shown, when the first memory read cycle shows a rising edge (at a pulse 40), the row address signal (SA0-11) increments thereby latching the subsequent memory read cycle (shown by a negative pulse 42) to the subsequent row in the DRAM 12. In the preferred embodiment, this occurs for four rows with the final row address increment being stored in a counter in a typical fashion to provide the first row address for the next refresh operation.

As can be seen from the drawings of FIG. 3, a greater percentage of the time in which the bus 16 is tied up for the refresh operation, illustrated by the duration of the HLDA signal, the refresh signal itself is present on that bus as shown by the -REF signal. Accordingly, an improved efficiency is presented in the system, which allows the system to perform its refresh operations more quickly and enhance the overall system speed. Also, improved efficiency in the refresh operation provides an improved bus bandwidth for the system.

A more direct comparison between the timing diagrams of FIG. 2 and FIG. 3 illustrates the improvement in system operation afforded by the present invention. Two time periods of significance represent the potential refresh processing time savings through the burst method of the present invention. The first significant period, from the rising edge of the HLDA signal—indicative of bus access for the refresh operation—until the initiation of the NRAEN signal—indicative of the beginning of the memory set-up time for the memory read—can vary widely in duration. Once the HLDA signal goes active, NRAEN cannot enable refresh until the next rising edge in the DMACLK signal, to ensure that DMA operations are not interrupted or lost. Thus, a delay of from 125 nSec to 375 nSec accompanies the onset of refresh.

The second significant period occurs at the end of refresh. The HLDA signal cannot go low until the next rising edge of the DMACLK signal subsequent to the termination of the NRAEN signal. Thus, the bus cannot be released for other operations for up to 250 nSec. after refresh ends in a non-burst mode (125 nSec in burst mode).

The present invention utilizes a burst refresh technique which seeks to minimize the impact of the described-delay periods associated with the onset and the end of the refresh operation. Through the burst method, these delay periods occur only once per refresh operation, rather than once per DRAM row being refreshed. This represents a potential time savings of $(n-1)$ times the length of these delay periods, where n is the number of rows refreshed during each burst refresh operation.

Although the present method provides significant operating time savings, practical considerations impose limits on the length of the burst refresh. Initially, it should be recognized that the occurrence of the HLDA signal (tie-up of the bus) will not always be almost 250 nSec. before the refresh enable signal (the next rising edge in the DMACLK signal). Likewise, the termination of the HLDA signal (release of the bus) will not always trail the end of the refresh enable by nearly 250 nSec. Rather, each delay will be about one-half the possible maximum on the average. This must be balanced against the increase in memory set time associated with multiple memory read operations being performed during the burst refresh. Hence, the time savings are not unlimited.

The actual operating time savings which may be expected may be more fully understood by referring now to FIG. 2A. In that figure, the time necessary for a single refresh cycle, once the bus hold has been granted, is shown as $T_1+T_3+T_4+T_5+T_2$, where $T_1$ = time from HLDA active to REFRESH active,
$T_2$ = time from REFRESH inactive to HOLD inactive,
$T_3$ = RAM set-up time after REFRESH active and before MEMR active,
$T_4$ = MEMR pulse width, and
$T_5$ = RAM precharge time, from MEMR inactive to REFRESH inactive or next MEMR active.

When refresh operations are performed singly, (non-burst mode), each of these identified time periods must elapse before the bus is released. In contrast, with the burst refresh method of the present invention, $T_1$, $T_2$, and $T_3$ elapse only once per burst. Only $T_4$ and $T_5$ are repeated for each refresh operation in the burst.

This can represent a significant savings in time spent performing refresh operations. For example, with typical time values of $T_1=125$ nSec, $T_2=62$ nSec, $T_3=125$ nSec, $T_4=250$ nSec, $T_5=125$ nSec and refresh requests occurring every 15 $\mu$Sec, a non-burst mode system may spend as much as 4.4% of its operating time in the refresh mode. When two refresh operations are performed for each bus acquisition, the percentage drops to 3.4%. Additional time savings may be realized as shown by the following table, which represents empirical data:

TABLE I

| # of rows sequentially refreshed per burst | % time spent refreshing |
| --- | --- |
| 1 (non-burst) | 4.4% |
| 2 | 3.4% |
| 3 | 3.1% |
| 4 | 2.9% |
| 5 | 2.8% |
| 6 | 2.7% |

Actual savings for any particular system may vary, e.g., according to access speed of the DRAM devices. The above data is given solely for exemplary purposes.

Additional advantages may be obtained from use of the burst refresh method according to the present invention. For example, the burst refresh method also may ensure compliance with manufacturer specifications as to DRAM operation while facilitating minimization of RAM access time through advanced addressing schemes. DRAM manufactures typically specify maximum periods of continuous RAS line active. However, memory designs frequently operate in a page mode, i.e., a latch saves the previous row address and the RAS line remains active at the conclusion of a RAM cycle. During the next RAM cycle, the row address is compared to that stored in the latch. If they match (referred to as a "page hit"), the RAM access occurs without strobing the current row address into the RAM. This significantly reduces the RAM access time. If the row address does not match that stored in the latch (referred to as a "page miss"), the RAS line must go inactive and the new address strobed into the RAM. The longer RAM access time associated with a page miss requires the addition of wait states to allow completion of the RAM access cycle.

As mentioned, DRAM manufacturers specify the maximum RAS active time. Typical values for this parameter are approximately 75 μSec. Traditional refresh techniques accommodate this parameter value as refresh occurs once every about 15 μSec. and for the refresh operation the CPU issues a hold acknowledge (HLDA) signal, which forces the RAS line inactive.

Although traditional refresh techniques satisfy RAS active time parameters, they tend to propagate page misses by forcing the RAS line inactive more frequently than necessary. This tends to diminish overall system speed by increasing the average RAM access time, in addition to the above-discussed system inefficiencies with refresh control of the system bus every 15 μSec.

Accordingly, the system of the preferred embodiment of the present invention accomplishes additional enhancements to a computer operating system. The choice of four rows being sequentially refreshed per burst ensure that the RAS line is not forced inactive by the refresh operation except once every about 62.5 μSecs., unless a page miss occurs because of a row address change. At the same time, the initiation of the burst refresh will precipitate the HLDA signal from the CPU once every 62.5 μSecs., thereby forcing the RAS line inactive within the specified 75 μSec. interval. Thus, the burst refresh method of the present invention guarantees compliance with typical manufacturer specifications for maximum RAS line active time, maximizes the likelihood of a page hit within the RAS active constraints and enhances system performance by optimizing bus time for refresh.

Figure 4:
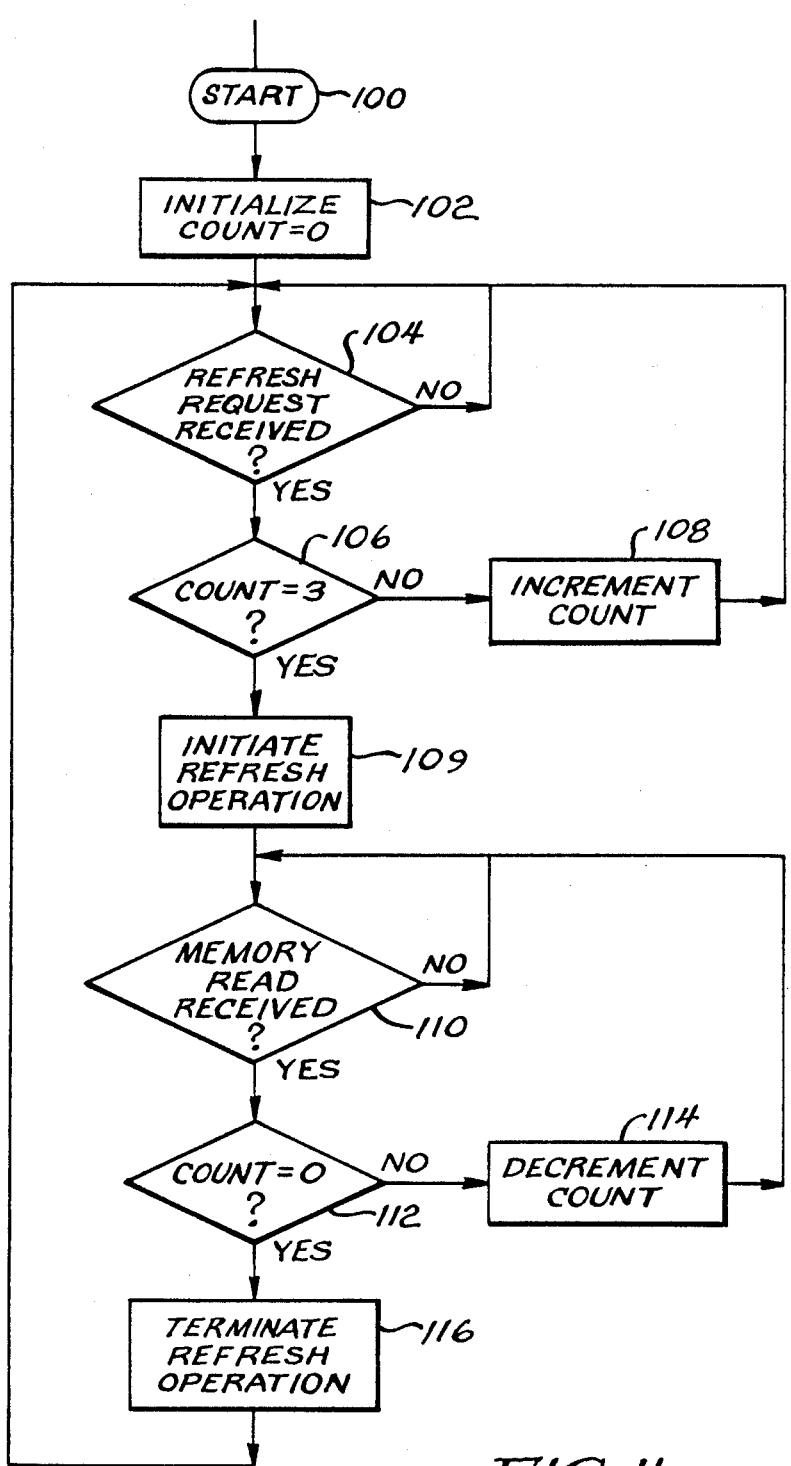
FIG. 4 is a flow chart representation of the burst refresh logic sequence according to a preferred embodiment of the invention.

The flow chart of FIG. 4 represents the logical steps implemented to create the burst refresh of the preferred embodiment of the present invention. Beginning at a start block 100, at reset the system initializes a count to zero as shown at a block 102. The refresh controller then determines whether a refresh request clock signal has been received as shown at a decision block 104. If not, the system loops back and continues to look for a clock signal associated with refresh request in a typical computer system. Once a refresh request has been acknowledged at the block 104, the system advances logically to a decision block 106 at which it assesses whether the count is equal to three in the preferred embodiment. If the count has not reached three, the system then increments the count as shown at a block 108 and loops back to look for another refresh request clock signal. Once the count reaches three, as assessed at the decision block 106, the system initiates the refresh operation at a block 109. Once the refresh operation has been initiated, the system looks for memory read signals as discussed above and as shown at a decision block 110. If a memory read signal is not received, the system loops back until a memory read signal is received. At that time, the system advances to a decision block 112, at which it determines whether the count is zero. If not, the system decrements the count as shown at a block 114 and loops back to wait for further memory read signals. Once the count reaches zero, as assessed at the decision block 112, the system terminates the refresh operation as shown at a block 116, thereby releasing the hold on the bus to the DRAM and loops back to begin accumulating a count of refresh request clock signals again.

The system of the preferred embodiment could be configured to count to four and still implement the chosen method of four rows being sequentially refreshed per burst simply by assessing the count value after incrementing. Such modifications may be made as a matter of design choice. Similar modifications may be made in the state machine representations of FIGS. 5 and 6. Other modifications may be made as a matter of design choice, such as the number of refreshes implemented per burst, without departing from the spirit of the present invention.

The system of the present invention is shown implemented in a typical computer configuration of FIG. 1. Therein, the refresh controller 22 is shown as receiving signals from the DMA controller 18 and proving signals to the DMA controller 18. The refresh controller 22 is also shown as providing addresses to the bus 16 for the DRAM 12. It is envisioned that the refresh controller 22 may be implemented through the use of a standard program logic array (PAL). A PAL currently used in typical systems for single row refresh operations may be modified in accordance with the logic of the FIG. 4 to provide the improved burst refresh technique of the present invention. It would be apparent to those skilled in the art that the number of clocked refresh signals accumulated prior to initiating the refresh operation and seizing the bus to the DRAM may depend upon particular applications. As explained previously, the preferred embodiment of the present invention initiates refresh operations in response to every fourth refresh clock signal. Thus, the system of the preferred embodiment undergoes a refresh operation once every about 62 μSec., as compared to once every 15 μSec. for single row refresh techniques. This provides significant performance improvement and also allows use of the refresh operation to prevent exceeding the RAS active time specifications. Other systems utilizing different specifications, e.g., longer allowable RAS active time, may exhibit optimal performance for a different number of refresh operations per burst.

Figure 5:
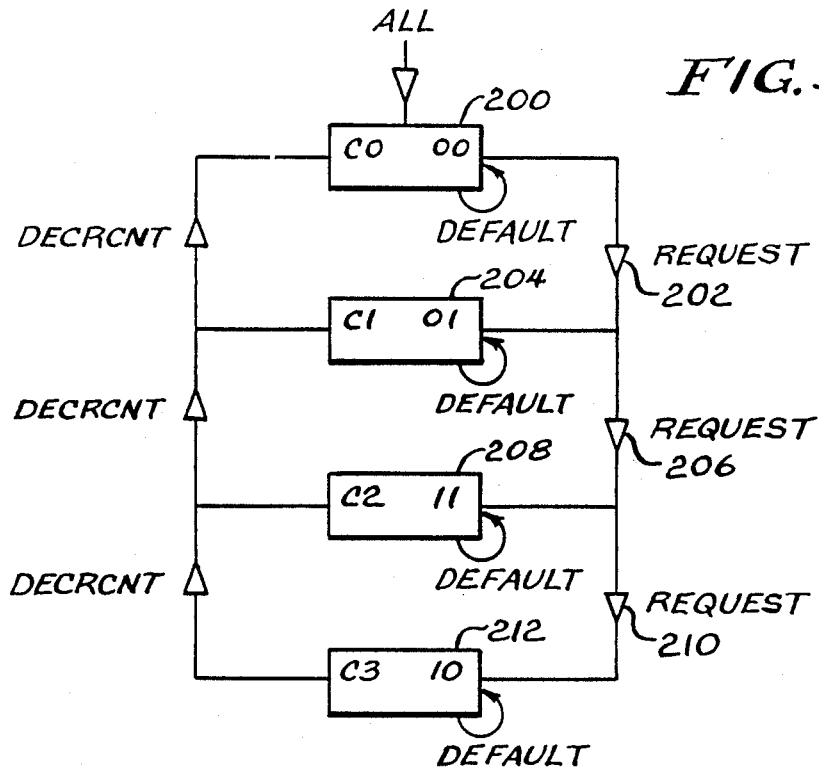
FIG. 5 is state machine diagram for a refresh controller programmable logic array according to preferred embodiment of the present invention.

FIG. 5 illustrates a state machine implementation, or modification of the typical PAL refresh controller, to accomplish the preferred four cycle refresh burst embodiment of present invention. As shown therein, a reset signal sets the initial state "C0,00" at a block 200. When a clocked refresh request is received as represented by the downward arrow 202, a higher state "C1,01" is achieved at a block 204. If the system has been configured for burst with four refreshes per burst, a subsequent clocked refresh request signal, represented by another downward arrow 206, initiates a next higher state "C2,11" as shown at a block 208. Correspondingly, a third request represented by an arrow 210 initiates a next higher state "C3,10" as shown at a block 212. In the preferred embodiment, state "C3, 10" is selected to cause a refresh operation to be initiated upon receipt of a subsequent refresh request signal.

Figure 6:
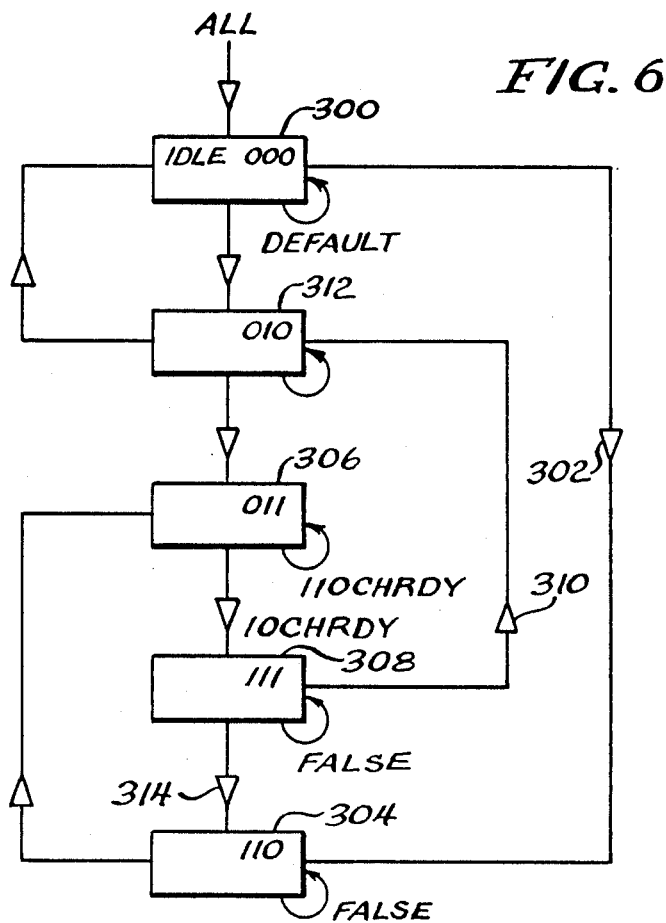
FIG. 6 is a related state machine diagram for programmable logic array for a refresh controller according to the present invention.

FIG. 6 illustrates a second state machine representation helpful in implementing a PAL to act as a refresh controller for the preferred embodiment of the present invention. As shown, a reset signal initiates a state of "idle, 000" at a block 300. Receipt of a refresh acknowledge signal in the nonburst mode, represented by an arrow 302, advances the system to a state "decrement, 110" at a block 304. The decrement state causes the request counter to decrement and moves the state machine from the state "C1", indicative of having received a refresh request, back to state "C0", indicative of no accumulated count of clock refresh requests. From the state block 304, the state machine of FIG. 6 advances to a "memory read-A,011" state at a block 306. At this block, the system checks whether the (IOCHRDY) IO channel ready signal is active. If so, the system advances to a "memory read-B,-111" state at a block 308. If IOCHRDY is not active, the system remains at the "memory read-A,011" state. The IOCHRDY signal thereby enables memory boards having slow DRAMs to extend the refresh cycle as necessary. The combination of the blocks 306 and 308 implements a memory read cycle as shown in FIGS. 2 and 3. At the state represented by the block 308, the system determines whether the count is zero, which it always will be in the nonburst mode. At count zero, illustrated as a directional arrow 310, the system advances to a state "010" at a block 312. This state introduces a short delay which guarantees that the RAS line recharges for further operation. The system then advances back to the state "idle, 000" illustrated as the block 300.

In contrast, if the system has been configured in the burst mode, receipt of the XREF signal causes the system to advance from the "idle" state at block 300 directly to the state "010" at the block 312. In the presence of the refresh signal, the system then advances to the "memory read-A" state at the block 306 and subsequently to the "memory read-B" state at the block 308. Again, at the state block 308, the system determines whether the count has reached zero. For the first memory read cycle in the burst mode the count will not be zero, and the system will advance as shown at an arrow 314 to the "decrement, 110" state illustrated at the block 304. Again, the decrement state causes the state machine of FIG. 5 to shift to a lower state. The initial decrement in the burst mode will cause a shift from state "C3" to state "C2". The second will cause a shift from state "C2" to the state "C1". The third will cause a shift from the state "C1" to the state "C0". Of course, as each decrement signal causes a state shift, a memory read operation is performed. Hence, the state machine of FIG. 5 shifts from "C1" to "C0", the fourth memory read operation illustrated by the combination of blocks 306 and 308 in FIG. 6 will implement the fourth memory read illustrated by the negative pulse 46 in the -MEMR waveform of FIG. 3. The state machine of FIG. 6 will then advance as shown by the arrow 310 to the brief delay illustrated at state block "010", block 312, and then back to the "idle, =000" state at the block 300. At this time, the burst refresh operation will be complete and the state machine of FIG. 5 will be in its initial, "C0,00", state shown at the block 200.

It will be appreciated by those skilled in the art that modifications to the foregoing preferred embodiment may be made in various aspects. The present invention is set forth with particularity in the appended claims. It is deemed that the spirit and scope of that invention encompasses such modifications and alterations to the preferred embodiment as would be apparent to one of ordinary skill in the art and familiar with the teachings of the present application.

What we claim is:

1. A method for maintaining information stored in a dynamic random access memory with a refresh controller, said method comprising:
   accumulating a count of a plurality of periodic refresh request signals;
   enabling said refresh controller to have control of said dynamic random access memory, said memory having a plurality of rows, when said count reaches a select number;
   sequentially refreshing a plurality of said rows equal in number to said select number; and
   disabling said refresh controller from having control of said dynamic random access memory after performing said sequentially refreshing step until a subsequent accumulated count reaches said select number.

2. The method of claim 1 wherein said select number is four.

3. The method of claim 1 wherein said refreshing step comprises:
   forcing an inactive state upon a row address strobe line in said dynamic random access memory.

4. A method for preserving the integrity of information stored in a dynamic random access memory having a row address strobe line comprising:
   establishing an initial state for a refresh controller;
   shifting said refresh controller to a higher state upon receipt of a refresh request signal;
   repeating said step of shifting said refresh controller to a higher state until said refresh controller achieves a selected state; then
   initiating a refresh operation upon receipt of a subsequent refresh signal.

5. The method of claim 4 further comprising:
   providing a memory read signal to said dynamic random access memory in response to said step of initiating; then
   shifting said refresh controller to a lower state upon termination of said memory read signal; and
   repeating said steps of providing a memory read signal and shift said refresh controller to a lower state until said refresh controller reaches said initial state.

6. The method of claim 4 further including:
   forcing said row address strobe line inactive upon initiating said refresh operation.

7. A method for enhancing page addressing of a dynamic random access memory, having a row address strobe line which is maintained active during page addressing, comprising:
   accumulating a count of a plurality of periodic memory refresh request signals; and
   causing said row address strobe line to change from an active state to an inactive state in conjunction with initiating a memory refresh operation when said accumulated count reaches a selected value.

8. The method of claim 7 further including:
   sequentially refreshing a plurality of rows of said random access memory after said initiating step, said plurality of rows corresponding to said selected value.

9. The method of claim 8 wherein said selected value is four.

10. A method for refreshing dynamic random access memory devices in a computer system wherein periodic memory refresh request signals are continually generated at a rate sufficient to refresh said memory devices with one row of said memory devices being refreshed per refresh request signal, said method comprising:
    accumulating a count of a plurality of said periodic memory refresh request signals and preventing memory refresh until said count reaches a predetermined value; then, upon said accumulated count reaching said predetermined value,
    sequentially refreshing a plurality of rows of said memory devices equal in number to said predetermined value; and then, upon said plurality of rows being refreshed,
    repeating continuously said accumulating and refreshing steps whereby each memory refresh event occurs after said accumulated count reaches said predetermined value.

11. A method for facilitating page mode addressing of dynamic random access memory device in a computer system wherein a row address strobe line is adapted to be continuously driven active throughout a plurality of sequential page mode memory access events and wherein a memory refresh disrupts page mode addressing to causing the row address strobe line to be momentarily driven inactive, said method comprising the steps of:

accumulating a count of a plurality of said periodic memory refresh request signals and preventing memory refresh until said count reaches a predetermined value; then, upon said accumulated count reaching said predetermined value, sequentially refreshing a plurality of rows of said memory devices equal in number to said predetermined value; and then, upon said plurality of rows being refreshed, repeating continuously said accumulating and refreshing steps whereby each memory refresh event occurs after said accumulated count reaches said predetermined value.

12. An apparatus for refreshing dynamic random access memory devices in a computer system wherein periodic memory refresh request signals are continually generated at a rate sufficient to refresh said memory devices with one row of said memory devices being refreshed per refresh request signal, said apparatus comprising:

means for accumulating a count of a plurality of said periodic memory refresh request signals and for preventing memory refresh until said count reaches a predetermined value; and means for sequentially refreshing a plurality of rows of said memory devices equal in number to said predetermined value upon said accumulated count reaching said predetermined value, whereby each memory refresh event occurs after said accumulated count reaches said predetermined value.

* * * * *

UNITED STATES PATENT AND TRADEMARK OFFICE
CERTIFICATE OF CORRECTION

PATENT NO. : 4,984,209

DATED : January 8, 1991

INVENTOR(S) : Babu Rajaram, Mark J. Foster

It is certified that error appears in the above-identified patent and that said Letters Patent is hereby corrected as shown below:

ON THE TITLE PAGE:

INVENTORS:    Item [75]    should read

Clark Buxton, St. Joseph, Michigan
   Robert A. Kohtz, St. Joseph, Michigan

Signed and Sealed this

Thirteenth Day of October, 1992

*Attest:*

DOUGLAS B. COMER

*Attesting Officer*     *Acting Commissioner of Patents and Trademarks*